United States Patent
Kim et al.

(10) Patent No.: US 10,292,276 B2
(45) Date of Patent: May 14, 2019

(54) METHOD OF MANUFACTURING A HYBRID METAL PATTERN BY USING WIRE EXPLOSION AND LIGHT-SINTERING, AND A HYBRID METAL PATTERN MANUFACTURED THEREBY

(71) Applicant: IUCF-HYU (INDUSTRY-UNIVERSITY COOPERATION FOUNDATION HANYANG UNIVERSITY), Seoul (KR)

(72) Inventors: Hak-Sung Kim, Seoul (KR); Wan Ho Chung, Paju-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 3 days.

(21) Appl. No.: 15/649,718

(22) Filed: Jul. 14, 2017

(65) Prior Publication Data

US 2017/0318682 A1   Nov. 2, 2017

Related U.S. Application Data

(63) Continuation of application No. PCT/KR2016/000271, filed on Jan. 12, 2016.

(30) Foreign Application Priority Data

Jan. 16, 2015 (KR) .................. 10-2015-0007902

(51) Int. Cl.
  *H05K 3/12* (2006.01)
  *H05K 1/09* (2006.01)
  *H01M 10/42* (2006.01)

(52) U.S. Cl.
  CPC ........... *H05K 3/1258* (2013.01); *H05K 1/097* (2013.01); *H05K 3/125* (2013.01); *H05K 3/1225* (2013.01);
  (Continued)

(58) Field of Classification Search
  CPC ................................................. H05K 3/1258
  (Continued)

(56) References Cited

U.S. PATENT DOCUMENTS 6,914,372 B1 * 7/2005 Akiyama ............... B82Y 10/00
                                                   313/309
2004/0263044 A1 * 12/2004 Yoon ..................... B22F 1/0007
                                                   313/311

(Continued)

*Primary Examiner* — Igwe U Anya
(74) *Attorney, Agent, or Firm* — Sughrue Mion, PLLC

(57) ABSTRACT

The inventive concepts relate to a method of manufacturing a hybrid metal pattern and a hybrid metal pattern manufactured thereby. In the method, the hybrid metal pattern may be manufactured on a substrate (e.g., a flexible substrate), formed of various materials, at room temperature without damaging the substrate, by a wire explosion method in liquid and light-sintering. In more detail, when performing the wire explosion method in liquid according to conditions of the inventive concepts, metal particles having uniform nano-sizes and uniform micro-sizes can be formed by a simple process, and additional dispersing and collecting processes can be omitted. In addition, conductive hybrid ink is formed by adding a metal precursor and then is light-sintered. In this case, the hybrid metal pattern can be manufactured by a very simple process.

16 Claims, 10 Drawing Sheets

(52) U.S. Cl.
CPC ... *H01M 2010/4292* (2013.01); *H05K 3/1275* (2013.01); *H05K 2201/026* (2013.01); *H05K 2203/0139* (2013.01); *H05K 2203/1131* (2013.01)

(58) Field of Classification Search
USPC .......................................................... 257/786
See application file for complete search history.

(56) References Cited

U.S. PATENT DOCUMENTS

| | | | |
|---|---|---|---|
| 2007/0202258 A1* | 8/2007 | Yamagata | B01L 3/0268 427/282 |
| 2008/0216604 A1* | 9/2008 | Cho | B22F 1/0018 75/345 |
| 2015/0000469 A1* | 1/2015 | Lee | B22F 9/14 75/354 |
| 2016/0002379 A1* | 1/2016 | Kitajima | C09D 133/14 524/430 |

* cited by examiner

METHOD OF MANUFACTURING A HYBRID METAL PATTERN BY USING WIRE EXPLOSION AND LIGHT-SINTERING, AND A HYBRID METAL PATTERN MANUFACTURED THEREBY

CROSS-REFERENCE TO RELATED APPLICATION

This application is a continuation of pending International Application No. PCT/KR2016/000271, which was filed on Jan. 12, 2016 and claims priority to Korean Patent Application No. 10-2015-0007902, filed on Jan. 16, 2015, in the Korean Intellectual Property Office, the disclosures of which are hereby incorporated by reference in their entireties.

BACKGROUND

1. Field

Embodiments of the inventive concepts relate to a method of manufacturing a hybrid metal pattern by using a wire explosion method and a light-sintering method, and a hybrid metal pattern manufactured thereby.

2. Description of the Related Art

To print an electronic pattern of a device, metal nanoparticles (e.g., gold, silver, or copper) are produced and conductive ink is produced by dispersing the metal nanoparticles in a solvent.

Generally, the metal nanoparticles are produced by at least one of an atomization method, a liquid-phase reduction method, a method using plasma, or a sol-gel method. However, the atomization method among these methods may produce particles having sizes of 30 µm to 50 µm but may not produce nano-sized particles. The liquid-phase reduction method may produce only several kinds of noble metal particles having nano-sizes and may increase production costs. The method using plasma may increase power consumption, and particles produced by the method using plasma may be easily oxidized when they are produced.

In the sol-gel method, metal ions of a precursor are formed into metal particles, and thus nano-sized particles can be produced. However, since the sol-gel method is complicated and should be accurately controlled, it has limitations in industrial applications.

A technique or method for manufacturing conductive particles by a wire explosion method using pulse power has been developed to solve the above problems. In this method, a metal wire is provided in a wire explosion apparatus filled with air or an inert gas and then is evaporated by electrical explosion using the pulse power. Thereafter, nano-sized particles are collected through cooling/condensation. Therefore, this method is very important in industrial applications and is economically useful because it can be mass-produced.

However, since the particles are exposed to the air in the wire explosion method performed using the pulse power in the gas, they may be easily oxidized, may not be collected in the apparatus, and may be deposited. Thus, an additional process for treating theses may be required and there may be a high probability of explosion. In addition, the nano-sized particles manufactured by the wire explosion method may be agglomerated.

A wire explosion method performed in liquid may solve the problems caused by the wire explosion method performed in the gas. However, in this case, nanoparticles may also be oxidized by oxygen dissolved in the liquid. In addition, the particles may also be agglomerated in this method, and thus an additional dispersion process may be required to use the particles as the conductive ink.

Furthermore, the particles manufactured by the wire explosion method performed in liquid may have relatively great sizes ranging from 50 nm to 100 nm, and thus energy required for sintering may be great in processes of printing and sintering the conductive ink including the particles. In addition, a space (hereinafter, referred to as 'a pore') may be formed between the particles after the sintering, and thus the particles are unsuitable as the conductive ink since conductivity thereof is low.

SUMMARY

Embodiments of the inventive concepts may provide a method of manufacturing a hybrid metal pattern by using a process of forming conductive ink including metal particles having desired sizes, a process of light-sintering the conductive ink, and a process of printing the conductive ink on a low-temperature substrate that has a large area and is bendable.

Embodiments of the inventive concepts may also provide a hybrid metal pattern having excellent conductivity, which is manufactured by the manufacturing method.

In an aspect, a method of manufacturing a hybrid metal pattern may include adjusting a gap between an anode and a cathode provided in a wire explosion apparatus, providing a metal wire between the anode and the cathode, supplying a dispersant and a solvent into the wire explosion apparatus, forming metal particles from the metal wire by wire explosion performed by applying a voltage between the anode and the cathode, separating conductive hybrid ink including the metal particles, the dispersant, and the solvent from the wire explosion apparatus, printing the separated conductive hybrid ink on a substrate to form a hybrid metal pattern, and light-sintering the hybrid metal pattern.

The adjusted gap between the anode and the cathode may range from 10 mm to 20 mm.

The metal wire may have a length of 10 mm to 20 mm and a diameter of 0.1 mm to 0.5 mm.

The metal wire may include one selected from a group comprising gold, silver, copper, nickel, zinc, and any compound thereof.

The solvent may include one selected from a group comprising distilled water, ethanol, methanol, diethylene glycol, butyl ether, and alpha-terpineol.

The wire explosion may be performed through 2000 to 3500 repeated explosions by applying a voltage of 300V to 1500V.

The metal particles formed by the wire explosion may include metal nanoparticles having diameters ranging from 10 nm to 40 nm, and metal microparticles having diameters ranging from 5 µm to 15 µm.

The wire explosion may be performed through 3300 to 3500 repeated explosions by applying a voltage of 200V to 400V.

The wire explosion may be performed through 2000 to 2200 repeated explosions by applying a voltage of 1300V to 1700V.

The method further include adding one or more selected from a group comprising a metal precursor, carbon nanotube (CNT), graphene, and graphene oxide into the wire explosion apparatus, between the supplying of the dispersant and the solvent and the forming of the metal particles.

The metal precursor may include one selected from a group comprising gold, silver, copper, nickel, zinc, and any mixture thereof.

The dispersant may include one copolymer selected from a group comprising disperbyk 180, disperbyk 111, polyvinylpyrrolidone (PVP), and styrene maleic anhydride copolymer (SMA 1440flake) or includes one compatible carrier selected from a group comprising 2-butoxyethyl acetate, propylene glycol monoethyl ether acetate, diethylene glycol monoethyl ether acetate, ethylene glycol butyl ether, cyclohexanone, cyclohexanol, 2-ethoxyethyl acetate, ethylene glycol diacetate, terpineol, and isobutyl alcohol.

The printing of the separated conductive hybrid ink may be performed by one selected from a group comprising a screen printing method, an inkjet printing method, a gravure off-set method, and a gravure method.

Conditions of the light-sintering may include an intensity of 10 $J/cm^2$ to 30 $J/cm^2$, a pulse gap of 0 to 5 ms, and a pulse width of 5 ms to 10 ms when a pulse number ranges from 1 to 10.

Another aspect of the inventive concepts may provide a hybrid metal pattern manufactured by the manufacturing method.

The hybrid metal pattern may include metal particles and a dispersant, the metal particles may include nanoparticles and microparticles, and the metal particles may be formed by fusing the metal particles through light-sintering.

Diameters of the nanoparticles may range from 10 nm to 40 nm, and diameters of the microparticles may range from 5 μm to 15 μm.

A weight ratio of the nanoparticles:the microparticles in the metal particles may range from 1:0.01 to 1:0.5.

The hybrid metal pattern may further include one or more selected from a group comprising a metal precursor, carbon nanotube (CNT), graphene, and graphene oxide.

DETAILED DESCRIPTION OF THE EMBODIMENTS

Hereinafter, various aspects and various embodiments of the inventive concepts will be described in more detail.

An aspect of the inventive concepts relates to a method of manufacturing a hybrid metal pattern. The method includes adjusting a gap between an anode and a cathode provided in a wire explosion apparatus, providing a metal wire between the anode and the cathode, supplying a dispersant and a solvent into the wire explosion apparatus, forming metal nano/micro particles from the metal wire by wire explosion performed by applying a voltage between the anode and the cathode, forming conductive hybrid ink by mixing the metal nano/micro particles with the dispersant and the solvent provided in the wire explosion apparatus, separating the conductive hybrid ink from the wire explosion apparatus, printing the conductive hybrid ink on a substrate to form a hybrid metal pattern, and light-sintering the hybrid metal pattern.

Figure 1:
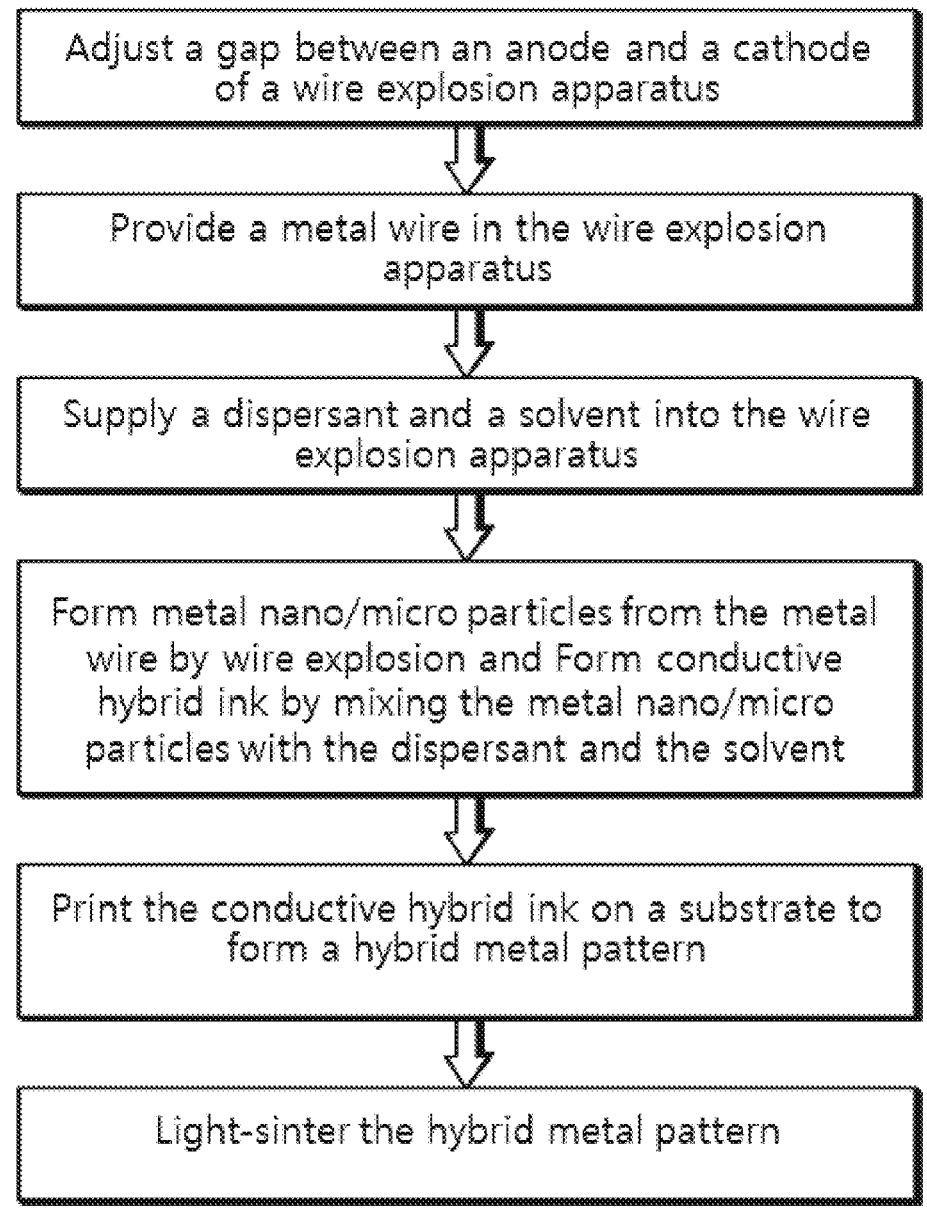
FIG. 1 is a flowchart illustrating a method of manufacturing a hybrid metal pattern, according to some embodiments of the inventive concepts.

Hereinafter, the method of manufacturing the hybrid metal pattern will be described in more detail. A flowchart of the method is illustrated in FIG. 1.

In the method of manufacturing the hybrid metal pattern according to the inventive concepts, first, the gap between the anode and the cathode provided in the wire explosion apparatus is adjusted.

At this time, the gap between the anode and cathode may range from 10 mm to 20 mm. If the gap is less than 10 mm, a length of the metal wire provided between the anode and the cathode is reduced to lower a content of generated metal particles. This causes an increase in consumed energy and an increase in process time.

In addition, if the gap is greater than 20 mm, a length of the metal wire provided between the anode and cathode is greater than a length in which the metal wire can be exploded, and thus the electrical wire explosion does not occur. In other words, the metal particles are not formed.

As a result, the wire explosion method may be performed under the aforementioned gap condition according to the inventive concepts, thereby obtaining the maximum metal particles with respect to consumed energy.

Thereafter, the metal wire is provided between the anode and the cathode, and the dispersant and the solvent are supplied into the wire explosion apparatus.

At this time, the metal wire may include one selected from a group comprising gold, silver, copper, nickel, zinc, and any compound thereof.

The metal wire may have a diameter of 0.1 mm to 0.5 mm, and a length of the metal wire may be equal to or greater than 10 mm. In particular, the length of the metal wire may range from 10 mm to 20 mm. This is because the gap between the anode and the cathode ranges from 10 mm to 20 mm.

However, in the event that a unit for transferring the metal wire into the wire explosion apparatus through a conveyor is further provided, the length of the metal wire may be greater than 20 mm.

Figure 2:
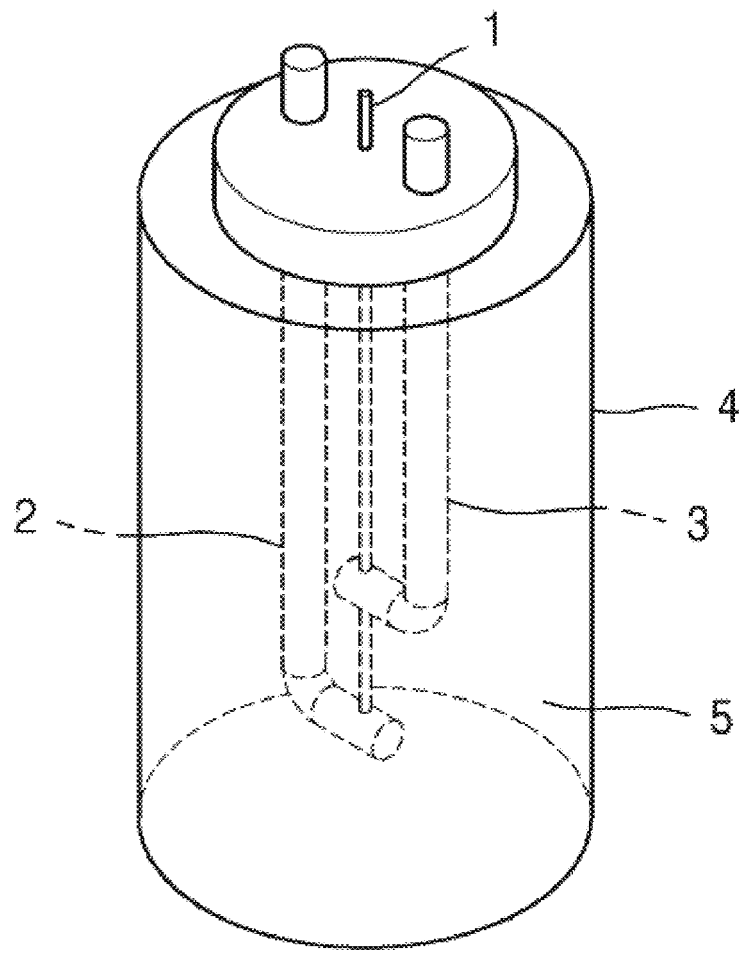
FIG. 2 is a view illustrating a wire explosion apparatus according to some embodiments of the inventive concepts.
Figure 3:
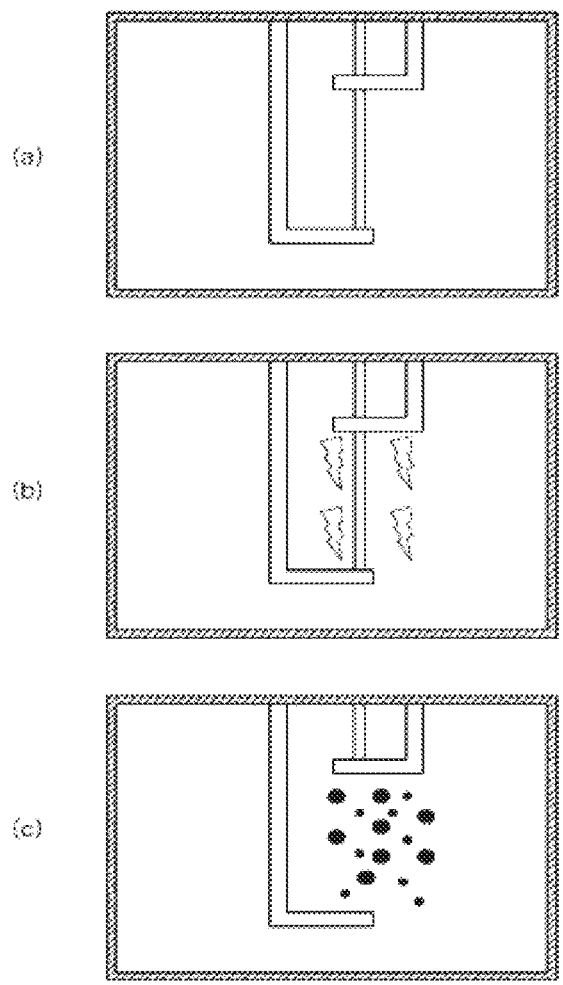
FIG. 3 is a conceptual view illustrating a wire explosion process that occurs in the wire explosion apparatus according to some embodiments of the inventive concepts.

The wire explosion apparatus in which the metal wire 1, the cathode 2, the anode 3, and the solvent 5 are provided is illustrated in FIG. 2 to explain the wire explosion apparatus according to some embodiments of the inventive concepts. In the present specification, the term 'gap' means a distance between the cathode 2 and the anode 3.

The solvent 5 may be one selected from a group comprising distilled water, ethanol, methanol, diethylene glycol, butyl ether, and alpha-terpineol. Here, the solvent may be suitably selected depending on a kind of the dispersant. For example, when the dispersant is a hydrophobic material, the solvent uses alpha-terpineol. In this case, cohesive force between the metal nanoparticles may be weakened and dispersibility of the metal nanoparticles may be maximally increased, and thus uniform metal nanoparticles may be manufactured.

The dispersant may stably prevent agglomeration of the metal particles during the wire explosion and may stably maintain the hybrid metal pattern during a drying process after the printing process. In addition, the dispersant may prevent the conductive hybrid ink from being evaporated in the light-sintering.

The dispersant may be one polymer selected from a group comprising disperbyk 180, disperbyk 111, polyvinylpyrrolidone (PVP), and styrene maleic anhydride copolymer (SMA 1440flake) or may be one compatible carrier selected from a group comprising 2-butoxyethyl acetate, propylene glycol monoethyl ether acetate, diethylene glycol monoethyl ether acetate, ethylene glycol butyl ether, cyclohexanone, cyclohexanol, 2-ethoxyethyl acetate, ethylene glycol diacetate, terpineol, and isobutyl alcohol. Here, it is preferable that polyvinylpyrrolidone (PVP) is used as the dispersant which caps surfaces of the metal nanoparticles to weaken the cohesive force between the metal nanoparticles.

A volume of the supplied solvent may be suitably adjusted depending on a size of the wire explosion apparatus and the metal wire. In other words, the solvent may be supplied into the wire explosion apparatus in such a way that the anode, the cathode, and the metal wire are immersed in the solvent. For example, in the present embodiment, the volume of the solvent may range from 100 ml to 1000 ml.

In some embodiments, a content of the dispersant may range from 0.1 wt % to 20 wt % with respect to a total weight of solids of the conductive hybrid ink. If the content of the dispersant is greater than 20 wt %, the dispersant may affect the wire explosion process of the inventive concepts, and thus metal particles having uniform sizes may not be formed. If the content of the dispersant is less than 0.1 wt %, metal particles formed by the wire explosion process may be agglomerated.

Next, the metal particles are formed from the metal wire by the wire explosion performed by applying the voltage between the anode and the cathode, and the conductive hybrid ink including the metal particles, the dispersant, and the solvent is separated from the wire explosion apparatus.

In other words, the voltage is applied between the anode and the cathode provided in the wire explosion apparatus, and thus the metal wire is exploded to form the metal particles.

The wire explosion is wire explosion in liquid, which is performed in the dispersant and solvent supplied in the wire explosion apparatus. Thus, the wire explosion in liquid according to the inventive concepts may remarkably reduce explosion risk which may be caused by dust and deposition, as compared with wire explosion in a gas.

The metal particles formed through the above process are mixed with the dispersant and the solvent existing in the wire explosion apparatus to directly form the conductive hybrid ink. In other words, the conductive hybrid ink can be directly formed through a simple process.

In some embodiments, the wire explosion may be performed through 2000 to 3500 repeated explosions by applying a voltage of 300V to 1500V. By these conditions, the metal particles may include metal nanoparticles having diameters ranging from 10 nm to 40 nm and metal microparticles having diameters ranging from 5 μm to 15 μm.

In other words, when the wire explosion is performed under the above conditions, the wire explosion can be accurately controlled to form the metal particles which include the metal nanoparticles having the diameters of 10 nm to 40 nm and the metal microparticles having the diameters of 5 μm to 15 μm. In addition, the metal particles may be naturally dispersed and may not be agglomerated.

Furthermore, when the metal particles are formed under the above conditions of the wire explosion, the metal particles can be very uniformly formed, and thus an additional collecting process is not needed. As a result, the conductive hybrid ink can be directly used.

Since the metal nanoparticles of 10 nm to 40 nm and the metal microparticles of 5 μm to 15 μm are generated at a suitable mixing ratio under the above conditions of the wire explosion, sizes of pores generated between the metal particles in a sintering process may be small to increase a density of the metal particles. As a result, the hybrid metal pattern manufactured using the metal particles can have excellent conductivity.

In addition, the metal particles having desired sizes can be formed by suitably changing the conditions of the wire explosion. In more detail, to form the metal particles that include metal nanoparticles having diameters ranging from 30 nm to 40 nm and metal microparticles having diameters ranging from 5 μm to 15 μm, the wire explosion may be performed through 3300 to 3500 repeated explosions by applying a voltage of 200V to 400V. To obtain more uniform metal nanoparticles, the wire explosion may be performed through 3400 to 3500 repeated explosions by applying a voltage of 250V to 350V.

On the other hand, to form the metal particles that include metal nanoparticles having diameters ranging from 10 nm to 20 nm and metal microparticles having diameters ranging from 5 μm to 15 μm, the wire explosion may be performed through 2000 to 2200 repeated explosions by applying a voltage of 1300V to 1700V. To obtain more uniform metal nanoparticles, the wire explosion may be performed through 2000 to 2100 repeated explosions by applying a voltage of 1400V to 1600V.

In addition, a weight ratio of the nanoparticles:the microparticles in the metal particles generated by the wire explosion may range from 1:0.01 to 1:0.5. If the weight ratio of the microparticles with respect to the nanoparticles is less than the range, resistivity of the conductive hybrid ink may not be reduced, a surface of the hybrid metal pattern may be uneven after printing, and conductivity of the conductive hybrid ink may be reduced. If the weight ratio of the microparticles is greater than the range, sintering efficiency may be reduced.

Next, the conductive hybrid ink separated from the wire explosion apparatus may be printed on the substrate to form the hybrid metal pattern.

At this time, the printing method may be one selected from a group comprising a screen printing method, an inkjet printing method, a gravure off-set method, and a gravure method.

Finally, the hybrid metal pattern is light-sintered.

Here, light-sintering conditions include an intensity of 10 $J/cm^2$ to 30 $J/cm^2$, a pulse gap of 0 to 5 ms, and a pulse width of 5 ms to 10 ms when a pulse number ranges from 1 to 10.

In particular, the intensity may range from 16 $J/cm^2$ to 30 $J/cm^2$ in the light-sintering conditions. If the intensity is greater than 30 $J/cm^2$, a formed pattern may be damaged or broken by excessive energy and a crack may occur between particles by the excessive energy, and thus a sheet resistance of the pattern may be increased.

If the intensity of the light-sintering conditions is less than 16 $J/cm^2$, energy required for sintering may not be sufficiently applied, and thus ink may not be properly sintered. In this case, conductivity of the pattern may be reduced and a resistance of the pattern may be increased.

In some embodiments, the manufacturing method may further include adding one or more selected from a group comprising a metal precursor, carbon nanotube (CNT), graphene, and graphene oxide into the wire explosion apparatus between the supplying of the dispersant and the solvent into the wire explosion apparatus and the forming of the metal nano/micro particles and the conductive hybrid ink through the wire explosion.

In other words, one or more selected from the group comprising the metal precursor, carbon nanotube (CNT), graphene, and graphene oxide may be added into the wire explosion apparatus before the wire explosion is performed. At this time, the metal precursor may include one selected from a group comprising gold, silver, copper, nickel, zinc, and any mixture thereof.

In the case in which one or more selected from the group comprising the metal precursor, carbon nanotube (CNT), graphene, and graphene oxide is added into the wire explosion apparatus before the wire explosion is performed, it is possible to reduce or minimize an agglomeration phenomenon occurring between the metal particles in the wire explosion process and it is possible to prevent oxidation caused by dissolved oxygen existing in the solvent. Thus, the conductive hybrid ink of which a degree of dispersion is excellent can be formed.

In addition, when the hybrid metal pattern is manufactured by printing and light-sintering the conductive hybrid ink which further includes one or more selected from the group comprising the metal precursor, carbon nanotube (CNT), graphene, and graphene oxide, the selected one or more may be located between the metal particles to further reduce sizes of the pores and to tightly connect the metal particles. In addition, even though a crack occurs in the pattern by bending of a flexible substrate, the selected one or more may act as a bridge connecting the metal particles to minimize or prevent deterioration of the conductivity of the pattern.

When the metal precursor includes copper, the metal precursor may include one or more selected from a group comprising copper nitrate, copper (II) trifluoroacetylacetonate, copper sulfate, copper chloride (I) [CuCl], copper chloride (II) [CuCl2], copper acetylacetonate [Cu(acac)2], copper hexafluoroacetylacetonate [Cu(hfac)2], copper trifluoroacetylchloride [Cu(tfac)2], copper dipivaloylmethanate [Cu(dpm)2], copper 6,6,7,7,7-pentafluoro-2,2-dimethyl-3,5-heptadion [Cu(ppm)2], copper heptafluorodimethyloctane [Cu(fod)2], copper 4-imino-2-pentanone [Cu(acim)2], copper 1,1,1,5,5,5-hexafluoro-4-[(2,2,2-trifluoroethyl)imino]-2-pentanone [Cu(nona-F)2], and copper acetylacetoethylenediamine [Cu(acen)2].

When the metal precursor includes silver, the metal precursor may include one or more selected from a group comprising silver nitrate, silver chloride, silver acetate, silver carbonate, silver tetrafluoroborate, silver sulfate, silver perchlorate, silver trifluoroacetate, silver iodide, silver cyanide, silver trifluoromethanesulfonate, silver bromide, silver hexafluorophosphate, silver sulfadiazine, silver perchlorate hydrate, silver sulfide, silver diethyldithiocarbamate, silver chromate, silver lactate, silver cyanate, silver benzoate, silver phosphate, silver acetylacetonate, silver proteinate, silver methanesulfonate, silver thiocyanate, silver(II) fluoride, silver cyclohexanebutyrate, silver hexafluoroantimonate(V), and silver methenamine.

When the metal precursor includes gold, the metal precursor may include one or more selected from a group comprising gold(III) chloride trihydrate, trifluorophosphine gold(I) chloride, perchloratobis(pentafluorophenyl)triphenylphosphine gold(III), gold(I) carbene, chloro(triphenylphosphine)gold(I), gold(I) iodide, trichloro(pyridine)gold(III), potassium gold(III) chloride, gold(I) cyanide, gold(III) bromide, gold(I) sulfide, chloro[1,3-bis(2,6-diisopropylphenyl)imidazol-2-ylidene]gold(I), gold(III) sulfide, (acetonitrile) [1,3-bis(2,6-diisopropylphenyl)imidazol-2-ylidene] gold(I) tetrafluoroborate, chloro(dimethylsulfide)gold(I), chloro(triethylphosphine)gold(I), methyl(triphenylphosphine)gold(I), (acetonitrile)[(2-biphenyl)di-tert-butylphosphine]gold(I) hexafluoroantimonate, chloro[1,3-bis(2,4,6-trimethylphenyl)imidazol-2-ylidene]gold(I), chloro [(1,1'-biphenyl-2-yl)di-tert-butylphosphine]gold(I), chloro (trimethylphosphine)gold(I), 2-dicyclohexylphosphino-2',4',6'-triisopropylbiphenyl gold(I) bis(trifluoromethanesulfonyl)imide, chloro(tri-tert-butylphosphine)gold(I), chloro [tris(2,4-di-tert-butylphenyl) phosphite]gold, chloro(dimethylphenylphosphine)gold, dichloro(2-pyridinecarboxylato)gold, chloro[2-dicyclohexyl (2',4',6'-trisopropylbiphenyl)phosphine]gold(I), chloro(tricyclohexylphosphine)gold(I), chloro[tris(para-trifluoromethylphenyl)phosphine]gold(I), chloro[tri(o-tolyl) phosphine]gold(I), chloro(methyldiphenylphosphine)gold (I), chloro(triisopropylphosphine)gold, (2-di-tert-butylphosphino-2',4',6'-triisopropylbiphenyl)gold(I) bis (trifluoromethanesulfonyl)imide, (2-di-tert-butylphosphinobiphenyl)gold(I) bis (trifluoromethanesulfonyl)imide, (2-dicyclohexylphosphino-2',6'-diisopropoxybiphenyl)gold (I) bis(trifluoromethanesulfonyl)imide, (2-dicyclohexylphosphinobiphenyl)gold(I) bis(trifluoromethanesulfonyl) imide, and (acetonitrile) [(2-di-tert-butylphosphino-3,4,5,6-tetramethyl)-2',4',6'-triisopropylbiphenyl]gold(I) hexafluoroantimonate.

When the metal precursor includes zinc, the metal precursor may include one or more selected from a group comprising zinc nitrate hydrate, zinc acetate dihydrate, zinc acetylacetonate hydrate, zinc hexafluoroacetylacetonate dihydrate, zinc trifluoroacetate hydrate, zinc chloride, zinc bromide, zinc stearate, zinc sulfate heptahydrate, zinc iodide, zinc cyanide, zinc pyrithione, zinc phthalocyanine, zinc phosphate, zinc methoxide, zinc acrylate, zinc fluoride, zinc trifluoromethanesulfonate, zinc methacrylate, zinc undecylenate, zinc selenide, zinc borate, zinc dimethyldithiocarbamate, zinc perchlorate hexahydrate, zinc naphthenate, zinc tetrafluoroborate hydrate, zinc selenite, 5,10,15,20-tetraphenyl-21H,23H-porphine zinc, zinc trifluoroacetate, zinc 1,2,3,4,8,9,10,11,15,16,17,18,22,23,24,25-hexadecafluoro-29H,31H-phthalocyanine, zinc 2,3,9,10,16,17,23,24- octakis(octyloxy)-29H,31H-phthalocyanine, [3,4-toluenedithiolato(2-)]zinc hydrate, zinc 5,10,15,20-tetra(4-pyridyl)-21H,23H-porphine, zinc 3,5-di-tert-butylsalicylate, zinc 2,9,16,23-tetra-tert-butyl-29H,31H-phthalocyanine, zinc 2,11,20,29-tetra-tert-butyl-2,3-naphthalocyanine, zinc 1,4,8,11,15,18,22,25-octabutoxy-29H,31H-phthalocyanine, zinc(II) tetranitrophthalocyanine, zinc di[bis(trifluoromethylsulfonyl)imide], and zinc p-toluenesulfonate hydrate.

When the metal precursor includes nickel, the metal precursor may include one or more selected from a group comprising nickel(II) nitrate hexahydrate, bis(methylcyclopentadienyl)nickel, manganese nickel carbonate, bis(triphenylphosphine)nickel(II) dichloride, nickel(II) iodide, nickel(II) chloride hexahydrate, nickel(II) acetate tetrahydrate, nickel sulfide, nickel peroxide, nickel boride, nickel(II) peroxide hydrate, nickel phosphide, nickel(II) sulfate, nickel (II) acetylacetonate, nickel(II) perchlorate hexahydrate, nickel(II) bromide, nickel(II) bromide ethylene glycol dimethyl ether complex, bis(1,5-cyclooctadiene)nickel(0), nickel(II) chloride ethylene glycol dimethyl ether complex, bis(ethylenediamine)nickel(II) chloride hydrate, and 5,10,15,20-tetraphenyl-21H,23H-porphine nickel(II).

However, in the case in which the mixed solution of the wire explosion apparatus further includes one or more selected from the group comprising the metal precursor, carbon nanotube (CNT), graphene, and graphene oxide as described above, the light-sintering conditions may include an intensity of 10 J/cm$^2$ to 13 J/cm$^2$, a pulse gap of 0 to 5 ms, and a pulse width of 5 ms to 10 ms when a pulse number ranges from 1 to 10.

Since the metal particles are more uniformly dispersed in the conductive hybrid ink further including the metal precursor, the conductive hybrid ink further including the metal precursor may be sintered at a lower temperature than the conductive hybrid ink not including the metal precursor.

Figure 9:
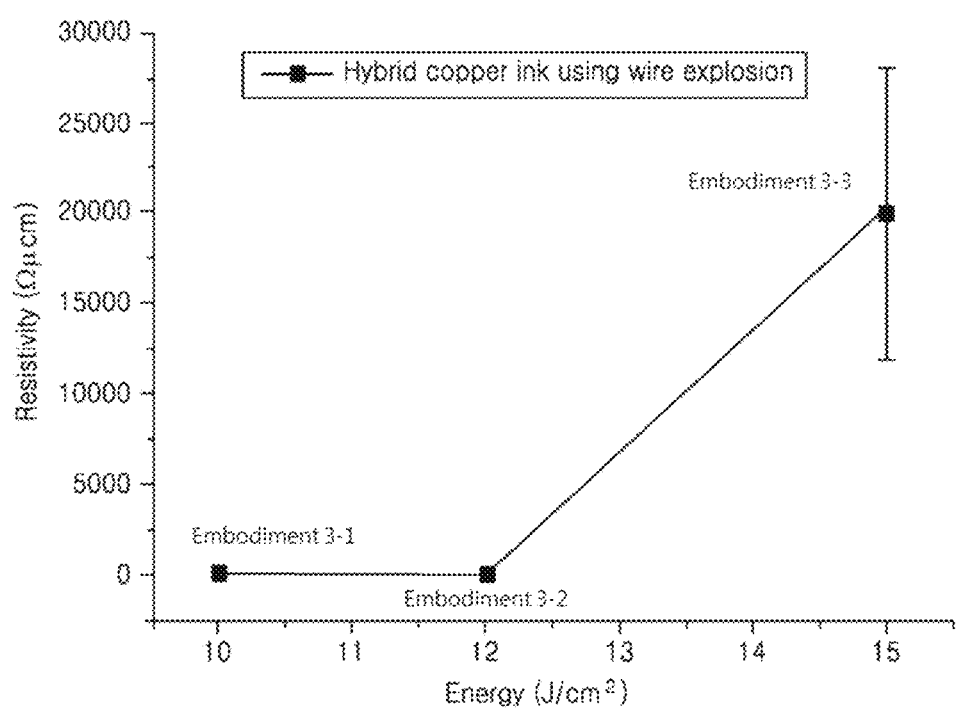
FIG. 9 is a graph illustrating resistivity of hybrid metal patterns manufactured by embodiments 3 (embodiments 3-1, 3-2, and 3-3) according to a change in intensity condition of light-sintering to check a change in resistance of a hybrid metal pattern when a light-sintering condition is changed.

Thus, the intensity of the light-sintering conditions may range from 10 J/cm$^2$ to 13 J/cm$^2$. If the intensity is greater than 13 J/cm$^2$, resistivity is markedly increased as illustrated in FIG. 9.

If the intensity of the light-sintering conditions is less than 10 J/cm$^2$, the hybrid metal pattern may not be sufficiently sintered due to lack of sintering energy, and thus the resistivity of the hybrid metal pattern may be increased.

Another aspect of the inventive concepts relates to the hybrid metal pattern manufactured by the manufacturing method described above.

The hybrid metal pattern includes metal particles and a dispersant, and the metal particles include nanoparticles and microparticles. The metal particles may be formed by fusing the metal particles through light-sintering.

Sizes (e.g., diameters) of the nanoparticles may range from 10 nm to 40 nm, and sizes (e.g., diameters) of the microparticles may range from 5 μm to 15 μm. The sizes of the nanoparticles and the microparticles may be appropriately selected in the ranges on the basis of the conditions of the wire explosion used to manufacture the hybrid metal pattern.

In more detail, when the wire explosion is performed through 2000 to 2200 repeated explosions by applying a voltage of 1300V to 1700V, nanoparticles of 10 nm to 20 nm can be obtained. When the wire explosion is performed through 3300 to 3500 repeated explosions by applying a voltage of 200V to 400V, nanoparticles of 30 nm to 40 nm can be obtained.

In other words, the particles having desired sizes can be formed by simple control of the conditions without an additional collecting process using a filter filtering desired particles, and thus a manufacturing time of the conductive hybrid ink can be reduced and the conductive hybrid ink can be efficiently mass-produced.

A weight ratio of the nanoparticles:the microparticles in the metal particles may range from 1:0.01 to 1:0.5.

If the weight ratio of the microparticles with respect to the nanoparticles is less than the range, resistivity of the conductive hybrid ink may not be reduced, a surface of the hybrid metal pattern may be uneven after printing, and conductivity of the conductive hybrid ink may be reduced. If the weight ratio of the microparticles is greater than the range, sintering efficiency may be reduced.

The dispersant may stably prevent agglomeration of the metal particles during the wire explosion and may stably maintain the hybrid metal pattern during a drying process after the printing process. In addition, the dispersant may prevent the conductive hybrid ink from being evaporated in the light-sintering.

The dispersant may include one copolymer selected from a group comprising disperbyk 180, disperbyk 111, polyvinylpyrrolidone (PVP), and styrene maleic anhydride copolymer (SMA 1440flake) or may include one compatible carrier selected from a group comprising 2-butoxyethyl acetate, propylene glycol monoethyl ether acetate, diethylene glycol monoethyl ether acetate, ethylene glycol butyl ether, cyclohexanone, cyclohexanol, 2-ethoxyethyl acetate, ethylene glycol diacetate, terpineol, and isobutyl alcohol.

A content of the dispersant may range from 0.1 wt % to 20 wt % with respect to a total weight of the hybrid metal pattern. If the content of the dispersant is less than 0.1 wt %, the pattern may not be maintained during the drying process after the printing and particles may be agglomerated in the wire explosion process. If the content of the dispersant is greater than the 20 wt %, a content of the metal particles in the hybrid metal pattern may be low to increase a distance between the metal particles, and thus conductivity of the hybrid metal pattern may be reduced and a resistance of the hybrid metal pattern may be increased.

The hybrid metal pattern is formed on a substrate. The substrate may be selected from a group comprising a polyimide (PI) film, a BT epoxy/glass fiber, a polyethylene (PT) film, and a photo paper.

The light-sintering may use white light irradiated from a xenon flash lamp. In more detail, the light-sintering conditions includes an intensity of 10 J/cm$^2$ to 30 J/cm$^2$, a pulse gap of 0 to 5 ms, and a pulse width of 5 ms to 10 ms when a pulse number ranges from 1 to 10.

In particular, the intensity may range from 16 J/cm$^2$ to 30 J/cm$^2$ in the light-sintering conditions. If the intensity is greater than 30 J/cm$^2$, a formed pattern may be damaged or broken by excessive energy and a crack may occur between particles by the excessive energy, and thus a sheet resistance of the pattern may be increased.

If the intensity of the light-sintering conditions is less than 16 J/cm$^2$, energy required for sintering may not be sufficiently applied, and thus ink may not be properly sintered. In this case, conductivity of the pattern may be reduced and a resistance of the pattern may be increased.

Meanwhile, the hybrid metal pattern may further include one or more selected from a group comprising a metal precursor, carbon nanotube (CNT), graphene, and graphene oxide. In this case, the light-sintering conditions may include an intensity of 10 J/cm$^2$ to 13 J/cm$^2$, a pulse gap of 0 to 5 ms, and a pulse width of 5 ms to 10 ms when a pulse number ranges from 1 to 10.

Since the metal particles are more uniformly dispersed in the conductive hybrid ink further including the metal precursor, the conductive hybrid ink further including the metal precursor may be sintered at a lower temperature than the conductive hybrid ink not including the metal precursor.

Thus, the intensity of the light-sintering conditions may range from 10 J/cm² to 13 J/cm². If the intensity is greater than 13 J/cm², resistivity is markedly increased as illustrated in FIG. 9. If the intensity of the light-sintering conditions is less than 10 J/cm², the hybrid metal pattern may not be sufficiently sintered due to lack of sintering energy, and thus the resistivity of the hybrid metal pattern may be increased.

Embodiments of the Inventive Concepts

The inventive concepts will be described more fully hereinafter with reference to the following embodiments. It should be noted, however, that the inventive concepts are not limited to the following embodiments. In addition, on the basis of the following embodiments, it will be apparent to those skilled in the art that various changes and modifications not suggesting experimental results may be made without departing from the spirits and scopes of the inventive concepts.

Manufacturing Example 1

A copper wire is provided between an anode and a cathode in a wire explosion apparatus, and a mixed solution including a dispersant and ethanol is supplied into the wire explosion apparatus. 20 g of polyvinylpyrrolidone (PVP) is dissolved in 500 ml of ethanol (solvent) for 30 minutes by sonication, thereby preparing the mixed solution. The copper wire has a length of 24 mm and a diameter of 0.15 mm.

Wire explosion is performed through 2000 repeated explosions by applying a voltage of 1500V between the anode and the cathode of the wire explosion apparatus having the mixed solution, thereby generating copper particles including copper nanoparticles and copper microparticles. Next, conductive hybrid ink in which the generated copper particles are uniformly dispersed is separated from the wire explosion apparatus.

Manufacturing Example 2

Conductive hybrid ink is obtained by the substantially same method as the manufacturing example 1, except that the wire explosion is performed through 3400 repeated explosions by applying a voltage of 300V to the wire explosion apparatus.

Manufacturing Example 3

A copper wire is provided between the anode and the cathode in the wire explosion apparatus, and a mixed solution including a copper precursor and ethanol is supplied into the wire explosion apparatus. 20 g of polyvinylpyrrolidone (PVP) is dissolved in 500 ml of ethanol (solvent) for 30 minutes by sonication, and 81 g of copper(II) trifluoro acetylacetonate is added into a solution including ethanol and polyvinylpyrrolidone (PVP) and is dissolved in the solution for 30 minutes. Thus, the mixed solution is prepared. The copper wire has a length of 24 mm and a diameter of 0.15 mm.

Wire explosion is performed through 3400 repeated explosions by applying a voltage of 300V to the wire explosion apparatus having the mixed solution in which the copper precursor is included, thereby generating copper particles including copper nanoparticles and copper microparticles.

Next, conductive hybrid ink in which the generated copper particles are uniformly dispersed and which includes the copper precursor, the dispersant, and ethanol is separated from the wire explosion apparatus.

Embodiment 1

The conductive hybrid ink obtained from the manufacturing example 1 is printed on a polyimide (PI) substrate, and the polyimide substrate having the conductive hybrid ink is dried on a hot plate for 30 minutes to manufacture a hybrid metal pattern.

Finally, the hybrid metal pattern is light-sintered by an ultrahigh frequency light-sintering apparatus using a xenon lamp. At this time, in light-sintering conditions, the pulse number is 1, the pulse width is 10 ms, and the pulse gap is 0 ms.

Figure 7:
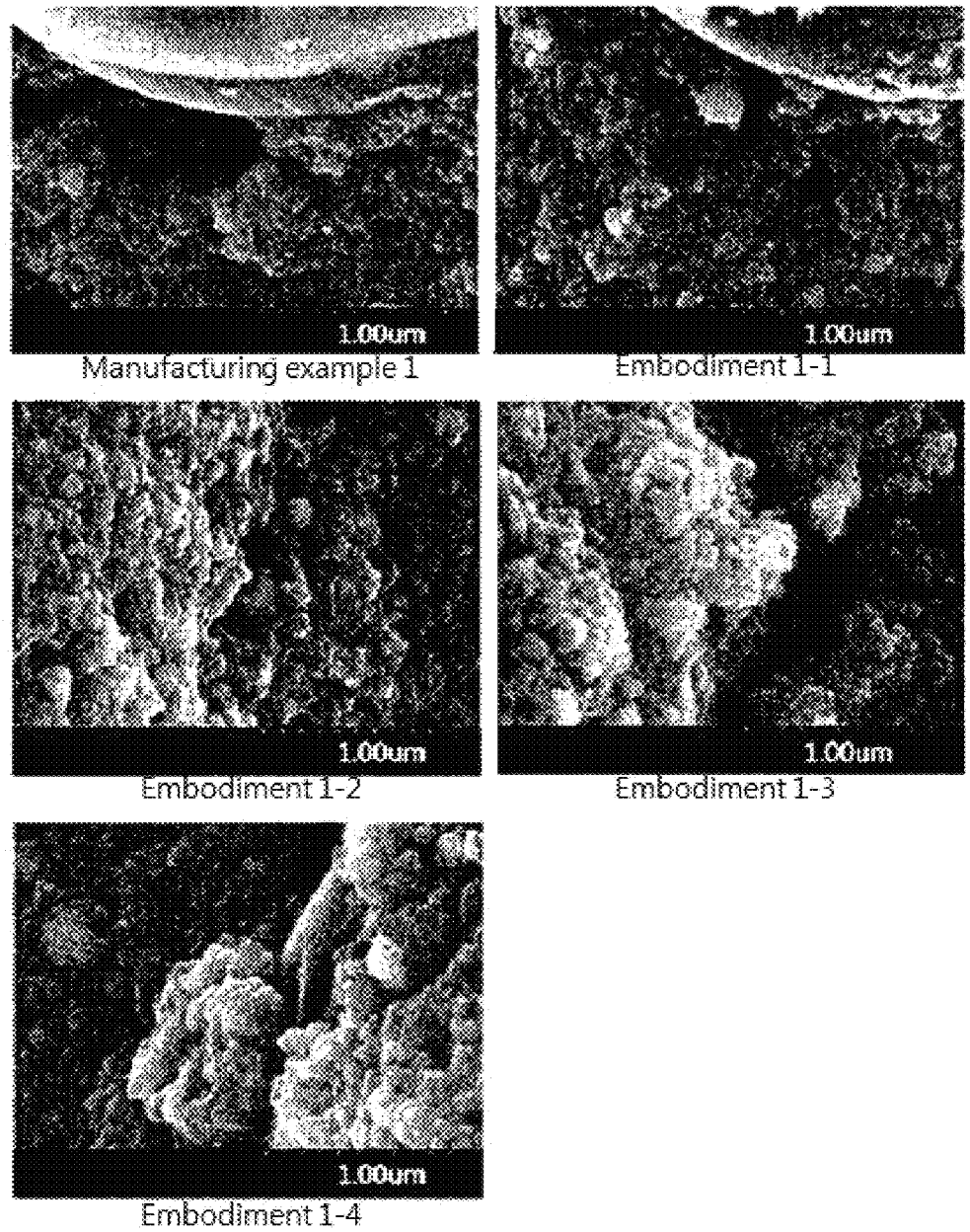
FIG. 7 illustrates SEM images of hybrid metal patterns manufactured by embodiments 1 according to a change in intensity condition of light-sintering to check a shape of a hybrid metal pattern when a light-sintering condition is changed.

Hybrid metal patterns (embodiments 1-1, 1-2, 1-3, and 1-4) are manufactured while changing only an intensity of the light-sintering conditions in the order of 12 J/cm², 16 J/cm², 18 J/cm², and 20 J/cm², and scanning electron microscopy (SEM) images of the hybrid metal patterns are shown in FIG. 7.

Embodiment 2

The conductive hybrid ink obtained from the manufacturing example 2 is printed on a polyimide (PI) substrate, and the polyimide substrate having the conductive hybrid ink is dried on a hot plate for 30 minutes to manufacture a hybrid metal pattern.

Finally, the hybrid metal pattern is light-sintered by an ultrahigh frequency light-sintering apparatus using a xenon lamp. At this time, in light-sintering conditions, the pulse number is 1, the pulse width is 10 ms, and the pulse gap is 0 ms.

Hybrid metal patterns (embodiments 2-1, 2-2, 2-3, and 2-4) are manufactured while changing only an intensity of the light-sintering conditions in the order of 12 J/cm², 16 J/cm², 18 J/cm², and 20 J/cm².

Embodiment 3

The conductive hybrid ink obtained from the manufacturing example 3 is printed on a polyimide (PI) substrate, and the polyimide substrate having the conductive hybrid ink is dried on a hot plate for 30 minutes to manufacture a hybrid metal pattern.

Finally, the hybrid metal pattern is light-sintered by an ultrahigh frequency light-sintering apparatus using a xenon lamp. At this time, in light-sintering conditions, the pulse number is 1, the pulse width is 10 ms, and the pulse gap is 0 ms.

Hybrid metal patterns (embodiments 3-1, 3-2, and 3-3) are manufactured while changing only an intensity of the light-sintering conditions in the order of 10 J/cm², 12 J/cm², and 15 J/cm².

Figure 4:
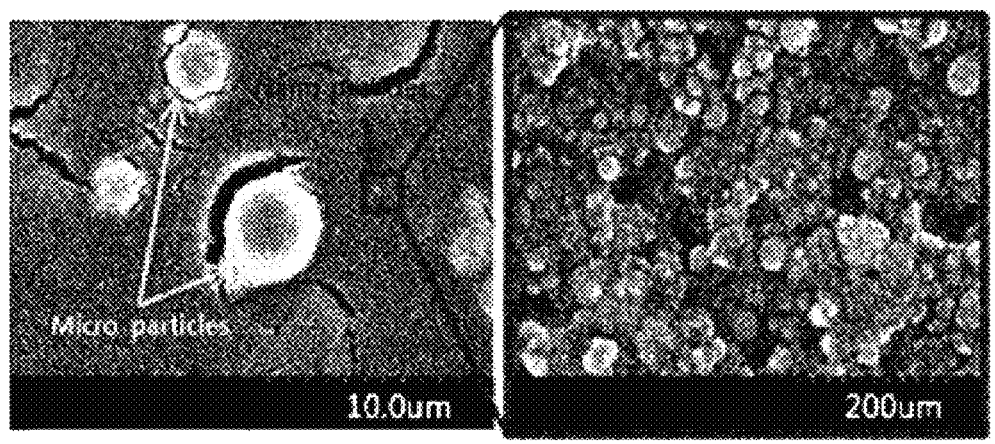
FIG. 4 illustrates scanning electron microscopy (SEM) images of conductive hybrid ink manufactured by a manufacturing example 2 to check a size of a metal particle manufactured by a wire explosion method according to some embodiments of the inventive concepts.

FIG. 4 illustrates SEM images of the conductive hybrid ink manufactured by the manufacturing example 2 to check a size of a metal particle manufactured by a wire explosion method according to some embodiments of the inventive concepts. In more detail, the conductive hybrid ink obtained from the manufacturing example 2 was printed on a polyimide substrate by a doctor blade method, the polyimide substrate having the conductive hybrid ink was dried on a hot plate for 2 hours, and then, SEM images thereof were acquired.

An image (b) of FIG. 4 is an enlarged image of a marked portion of an image (a) of FIG. 4 to check nanoparticles which are not shown in the image (a) of FIG. 4.

As shown in FIG. 4, the conductive hybrid ink obtained from the manufacturing example 2 includes microparticles having diameters of about 5 μm to about 10 μm and nanoparticles having diameters of about 30 nm to about 40 nm.

Figure 5:
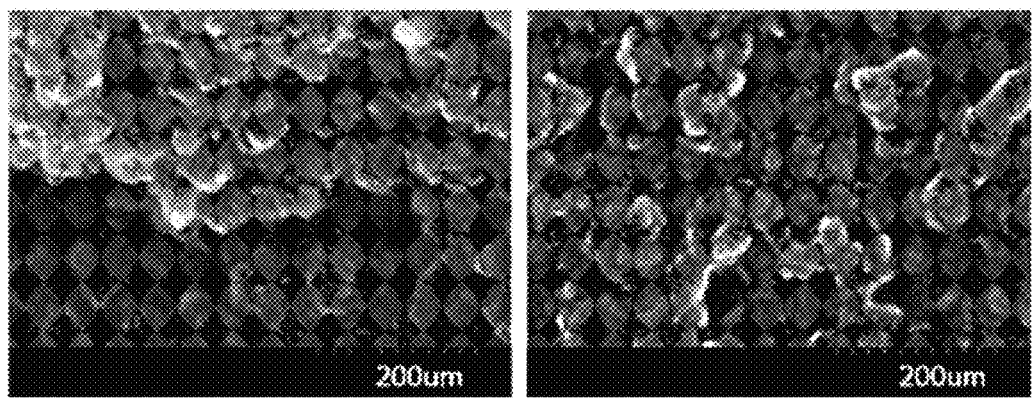
FIG. 5 illustrates SEM images of conductive hybrid inks manufactured by a manufacturing example 1 (a) and a manufacturing example 2 (b) to compare sizes of metal particles manufactured according to wire explosion conditions.

FIG. 5 illustrates SEM images of conductive hybrid inks manufactured by the manufacturing example 1 (a) and the manufacturing example 2 (b) to compare sizes of metal particles manufactured according to wire explosion conditions.

As shown in FIG. 5, sizes of nanoparticles in the generated metal particles decrease as the voltage applied in the wire explosion increases.

Figure 6:
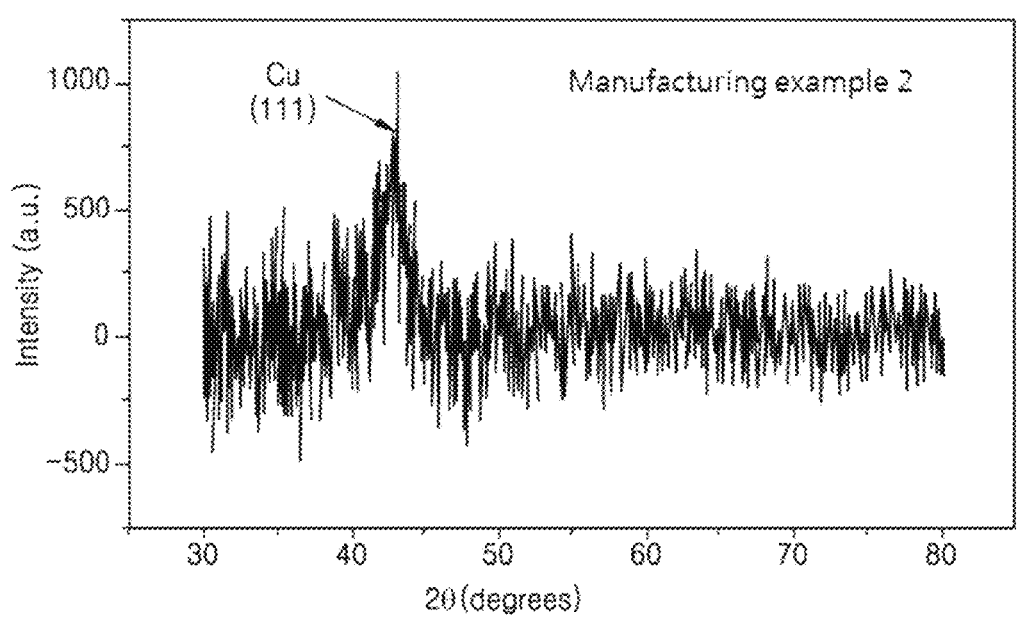
FIG. 6 is a graph of X-ray diffraction (XRD) analysis of conductive hybrid ink manufactured by a manufacturing example 2.

FIG. 6 is a graph of X-ray diffraction (XRD) analysis of conductive hybrid ink manufactured by the manufacturing example 2.

As shown in FIG. 6, the conductive hybrid ink (e.g., the metal particle) obtained from the manufacturing example 2 is not oxidized by the wire explosion but has a pure copper crystal.

FIG. 7 illustrates a SEM image of the conductive hybrid ink obtained from the manufacturing example 1 and SEM images of hybrid metal patterns manufactured by the embodiments 1 (the embodiments 1-1 to 1-4) according to a change in intensity condition of light-sintering to check a shape of a hybrid metal pattern when a light-sintering condition is changed.

As shown in FIG. 7, sizes of nanoparticles in the metal particles increase according to the change in the intensity of the light-sintering.

In addition, as the intensity increases, the nanoparticles are fused to the microparticle and are grown while connecting the microparticles.

In more detail, as shown in FIG. 7, the nanoparticles are sufficiently fused to the microparticle when the intensity is equal to or greater than 16 J/cm$^2$ in the light-sintering.

Figure 8:
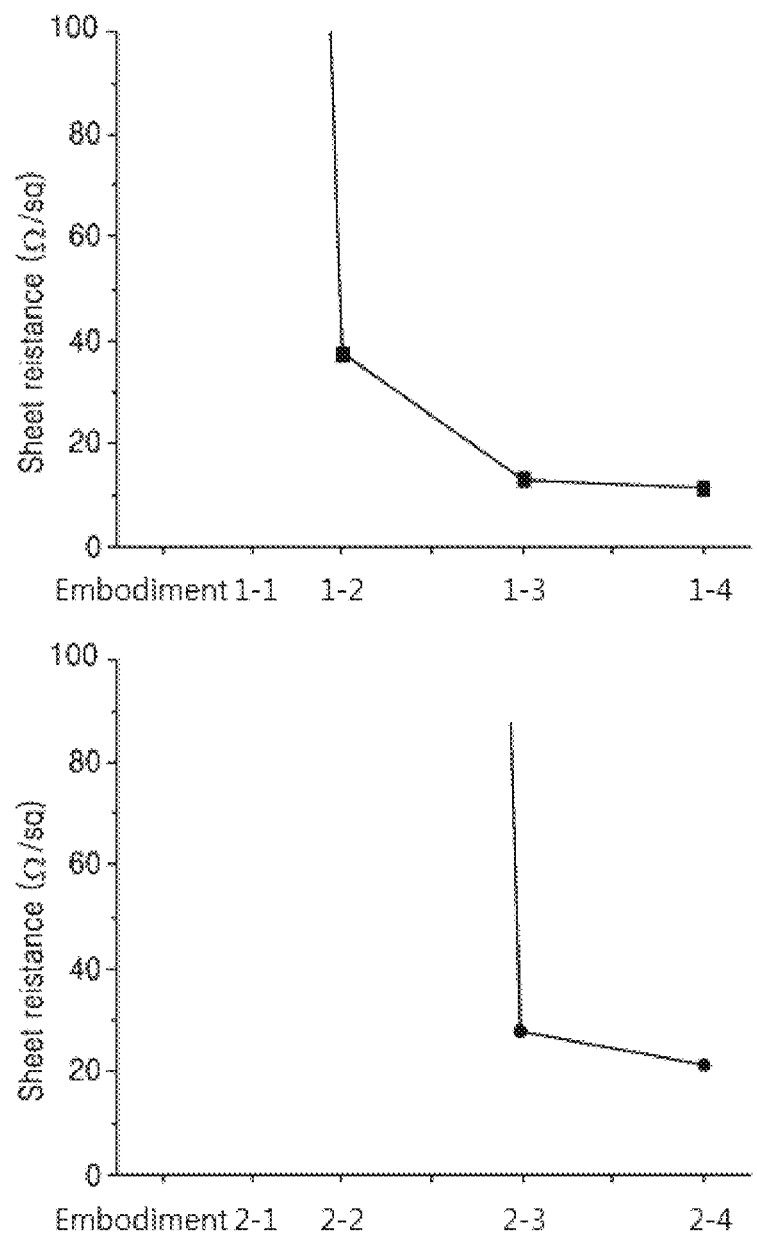
FIG. 8 illustrates graphs of sheet resistances of hybrid metal patterns manufactured by embodiments 1 and 2 according to a change in intensity condition of light-sintering to check a change in resistance of a hybrid metal pattern when a light-sintering condition is changed.

A graph (a) of FIG. 8 illustrates sheet resistances of the hybrid metal patterns manufactured by the embodiments 1 (the embodiments 1-1, 1-2, 1-3, and 1-4) according to the change in intensity condition of the light-sintering to check a change in resistance of a hybrid metal pattern when a light-sintering condition is changed.

A graph (b) of FIG. 8 illustrates sheet resistances of the hybrid metal patterns manufactured by the embodiments 2 (the embodiments 2-1, 2-2, 2-3, and 2-4) according to the change in intensity condition of the light-sintering to check a change in resistance of a hybrid metal pattern when a light-sintering condition is changed.

As shown in the graphs (a) and (b) of FIG. 8, the sheet resistance of the hybrid metal pattern is changed according to the intensity change in the light-sintering. In detail, the sheet resistance decreases as the intensity increases.

In particular, the sheet resistances of the hybrid metal patterns of the embodiments 1 are lower than those of the hybrid metal patterns of the embodiments 2. This is because the sizes of the metal particles (e.g., the metal nanoparticles) in the conductive hybrid ink used in the embodiments 2 are two or more times greater than the sizes of the metal particles (e.g., the metal nanoparticles) in the conductive hybrid ink used in the embodiments 1. Under the same energy (intensity) condition, the relatively small metal particles of the embodiments 1 are better sintered than the relatively large metal particles of the embodiments 2. Thus, the sheet resistances of the embodiments 1 are lower than those of the embodiments 2.

Thus, it is preferable that the intensity is equal to or greater than 16 J/cm$^2$ in the light-sintering. If the intensity is less than 16 J/cm$^2$, the fusion of the nanoparticles grown while connecting the microparticles may not be sufficient, and thus the sheet resistance may be increased.

In particular, the intensity may range from 16 J/cm$^2$ to 30 J/cm$^2$. If the intensity is greater than 30 J/cm$^2$, the formed pattern may be damaged or broken by excessive energy, and thus the sheet resistance of the pattern may be increased.

According to the inventive concepts, the conductive hybrid ink is formed using the wire explosion method, and the hybrid metal pattern is manufactured by printing and light-sintering the conductive hybrid ink. According to the results described above, the manufacturing method of the inventive concepts may markedly reduce conventional complicated processes in which ink formed by various methods (e.g., a sol-gel process) is sintered at low or high temperature to form a pattern. As a result, the manufacturing method according to the inventive concepts is very attractive in a printing electronic industry.

In particular, conventional conductive hybrid ink formed by only a wire explosion method may include metal particles which have various sizes and are not uniform. However, nano-sized particles which are substantially uniform can be formed under the above conditions according to the inventive concepts. In addition, since the conductive hybrid ink formed under the conditions described above is directly used without an addition collecting process, a collecting process using a filter and/or a dispersing process can be omitted.

Furthermore, since the conductive hybrid ink according to the inventive concepts can be sintered for a short time by using the ultrahigh frequency light-sintering apparatus without low-temperature sintering and high-temperature, a process time can be markedly reduced and a density of the particles can be increased. As a result, the conductivity of the hybrid metal pattern can be improved and the sheet resistance of the hybrid metal pattern may be significantly reduced.

FIG. 9 is a graph illustrating resistivity of the hybrid metal patterns manufactured by the embodiments 3 according to a change in intensity condition of light-sintering to check a change in resistance of a hybrid metal pattern when a light-sintering condition is changed.

As illustrated in FIG. 9, the hybrid metal pattern, which is manufactured by light-sintering the conductive hybrid ink formed using the mixed solution further including the copper precursor by the wire explosion, has resistivity of 27.9 μΩcm. This is lower than that of the conductive hybrid ink of the manufacturing example 1.

Figure 10:
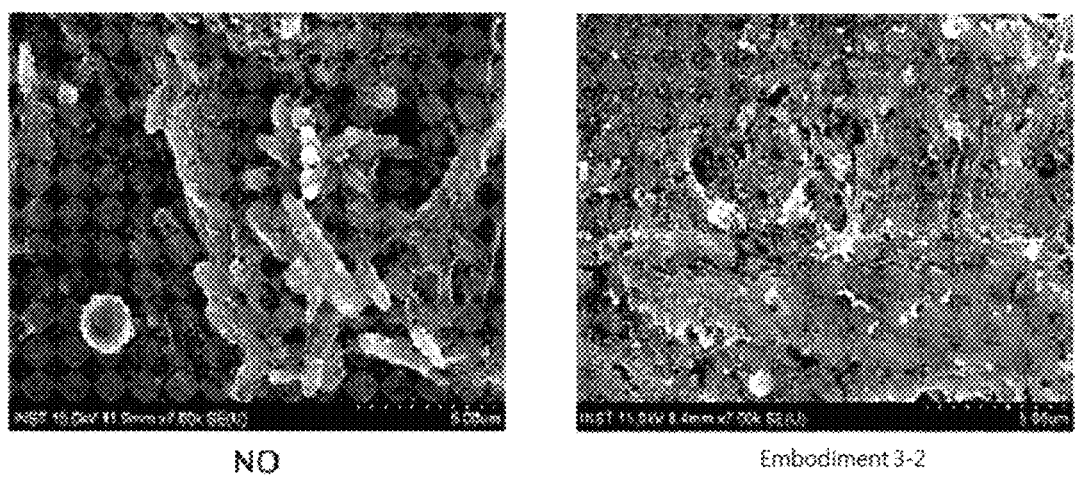
FIG. 10 illustrates SEM images of the hybrid metal pattern manufactured by the embodiment 3 (the embodiment 3-2) according to the change in intensity condition of the light-sintering to check a shape of a hybrid metal pattern when a light-sintering condition is changed.

FIG. 10 illustrates SEM images of the hybrid metal pattern manufactured by the embodiment 3 according to the change in intensity condition of the light-sintering to check a shape of a hybrid metal pattern when a light-sintering condition is changed.

As shown in FIG. 10, in the sintering process, the nanoparticles in the hybrid metal pattern of the embodiment 3 are fused to the microparticle and are grown while connecting the microparticles.

In addition, since the copper precursor fills pores formed between the nanoparticles, a structure of the hybrid metal pattern of the embodiment 3 is much denser than those of the hybrid metal patterns of FIG. 7. Thus, the hybrid metal pattern of the embodiment 3 has excellent resistivity.

However, since the hybrid metal pattern further including the copper precursor like the hybrid metal pattern of the embodiment 3 includes the metal particles which are more uniform and more dispersed, energy required for sintering is low. Thus, the intensity of the light-sintering conditions may range from 10 J/cm$^2$ to 13 J/cm$^2$. If the intensity is greater than 13 J/cm$^2$, the resistivity is markedly increased as illustrated in FIG. 9.

If the intensity of the light-sintering conditions is less than 10 J/cm$^2$, the hybrid metal pattern may not be sufficiently sintered due to lack of sintering energy, and thus the resistivity of the hybrid metal pattern may be increased.

The hybrid metal pattern may be manufactured on the substrate (e.g., a flexible substrate), formed of various materials, at room temperature without damage of the substrate, by the wire explosion method in liquid and the light-sintering. In more detail, when performing the wire explosion method in liquid according to conditions of the inventive concepts, metal particles having uniform nano-sizes and uniform micro-sizes can be formed by a simple process, and additional dispersing and collecting processes can be omitted. In addition, conductive hybrid ink is formed by adding a metal precursor and then is light-sintered. In this case, the hybrid metal pattern can be manufactured by a very simple process.

In the hybrid metal pattern, pores between particles, which may be generated in the sintering process, may be markedly reduced and a lot of neckings between particles may be formed. Thus, the hybrid metal pattern may have excellent conductivity and flexibility regardless of a thickness or an area of the pattern. Thus, a fine pattern may be formed on the flexible substrate by using the hybrid metal pattern. As a result, the quality of printing electronic parts may be improved.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a hybrid metal pattern, the method comprising:
   adjusting a gap between an anode and a cathode provided in a wire explosion apparatus;
   providing a metal wire between the anode and the cathode;
   supplying a dispersant and a solvent into the wire explosion apparatus;
   forming metal particles from the metal wire by wire explosion performed by applying a voltage between the anode and the cathode;
   separating conductive hybrid ink including the metal particles, the dispersant, and the solvent from the wire explosion apparatus;
   printing the separated conductive hybrid ink on a substrate to form a hybrid metal pattern; and
   light-sintering the hybrid metal pattern,
   wherein the metal particles comprise metal nanoparticles and metal microparticles, and
   wherein the solvent disperses the metal particles, and the dispersant caps surfaces of the metal particles.

2. The method of claim 1, wherein the adjusted gap between the anode and the cathode ranges from 10 mm to 20 mm.

3. The method of claim 1, wherein the metal wire has a length of 10 mm to 20 mm and a diameter of 0.1 mm to 0.5 mm.

4. The method of claim 1, wherein the metal wire includes one selected from the group consisting of gold, silver, copper, nickel, zinc, and any compound thereof, and
   wherein the solvent includes one selected from the group consisting of distilled water, ethanol, methanol, diethylene glycol, butyl ether, and alpha-terpineol.

5. The method of claim 1, wherein the wire explosion is performed through 2000 to 3500 repeated explosions by applying a voltage of 300V to 1500V.

6. The method of claim 5, wherein the metal nanoparticles have diameters ranging from 10 nm to 40 nm; and the metal microparticles have diameters ranging from 5 μm to 15 μm.

7. The method of claim 1, wherein the wire explosion is performed through 3300 to 3500 repeated explosions by applying a voltage of 200V to 400V.

8. The method of claim 1, wherein the wire explosion is performed through 2000 to 2200 repeated explosions by applying a voltage of 1300V to 1700V.

9. The method of claim 1, further comprising:
   adding one or more selected from the group consisting of a metal precursor, carbon nanotube (CNT), graphene, and graphene oxide into the wire explosion apparatus, between the supplying of the dispersant and the solvent and the forming of the metal particles,
   wherein the metal precursor includes one selected from the group consisting of gold, silver, copper, nickel, zinc, and any mixture thereof.

10. The method of claim 1, wherein the dispersant includes one copolymer selected from the group consisting of disperbyk 180, disperbyk 111, polyvinylpyrrolidone (PVP), and styrene maleic anhydride copolymer (SMA 1440flake) or includes one compatible carrier selected from the group consisting of 2-butoxyethyl acetate, propylene glycol monoethyl ether acetate, diethylene glycol monoethyl ether acetate, ethylene glycol butyl ether, cyclohexanone, cyclohexanol, 2-ethoxyethyl acetate, ethylene glycol diacetate, terpineol, and isobutyl alcohol.

11. The method of claim 1, wherein the printing of the separated conductive hybrid ink is performed by one selected from the group consisting of a screen printing method, an inkjet printing method, a gravure off-set method, and a gravure method.

12. The method of claim 1, wherein conditions of the light-sintering include an intensity of 10 J/cm$^2$ to 30 J/cm$^2$, a pulse gap of 0 to 5 ms, and a pulse width of 5 ms to 10 ms when a pulse number ranges from 1 to 10.

13. A hybrid metal pattern manufactured by the manufacturing method of claim 1,
   wherein the hybrid metal pattern comprises metal particles and a dispersant,
   wherein the metal particles comprise nanoparticles and microparticles, and
   wherein the metal particles are formed by fusing the metal particles through light-sintering.

14. The hybrid metal pattern of claim 13, wherein diameters of the nanoparticles range from 10 nm to 40 nm, and wherein diameters of the microparticles range from 5 μm to 15 μm.

15. The hybrid metal pattern of claim 13, wherein a weight ratio of the nanoparticles:the microparticles in the metal particles ranges from 1:0.01 to 1:0.5.

16. The hybrid metal pattern of claim 13, wherein the hybrid metal pattern further comprises one or more selected from the group consisting of a metal precursor, carbon nanotube (CNT), graphene, and graphene oxide.

* * * * *